(12) United States Patent
Cheng et al.

(10) Patent No.: US 6,357,131 B1
(45) Date of Patent: Mar. 19, 2002

(54) OVERLAY RELIABILITY MONITOR

(75) Inventors: Kun Pi Cheng; I-Chung Chang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,113

(22) Filed: Dec. 20, 1999

(51) Int. Cl.⁷ .............................. G01B 11/26
(52) U.S. Cl. ....................................... 33/645
(58) Field of Search ................ 33/286, 297, 568, 33/573, 613, 645; 414/936

(56) References Cited

U.S. PATENT DOCUMENTS

| | | | |
|---|---|---|---|
| 4,356,223 A | * 10/1982 | Iida et al. | 33/613 |
| 4,538,105 A | 8/1985 | Ausschnitt | |
| 4,571,538 A | 2/1986 | Chow | |
| 4,670,981 A | * 6/1987 | Kubota et al. | 33/613 |
| 4,934,064 A | * 6/1990 | Yamaguchi et al. | 33/645 |
| 5,280,437 A | 1/1994 | Corliss | |
| 5,504,999 A | * 4/1996 | Barr | 33/286 |
| 5,617,340 A | 4/1997 | Cresswell et al. | |
| 5,890,299 A | * 4/1999 | Giordano | 33/286 |
| 6,085,967 A | * 7/2000 | Grande et al. | 414/936 |
| 6,199,287 B1 | * 3/2001 | Rankila | 33/286 |

* cited by examiner

*Primary Examiner*—G. Bradley Bennett
(74) *Attorney, Agent, or Firm*—George O. Saile; Stephen B. Ackerman

(57) ABSTRACT

A method of overlaying two images and from this overlay observe and measure the accuracy of the alignment of the wafer. Wafer misalignment can be readily corrected based on the results of these observations. Alignment marks are provided on the surface of the wafer that is being validated for accuracy of alignment. The position of this mark relative to a pattern provided on the surface of a control wafer is measured and forms an indication of the alignment of the wafer.

29 Claims, 5 Drawing Sheets

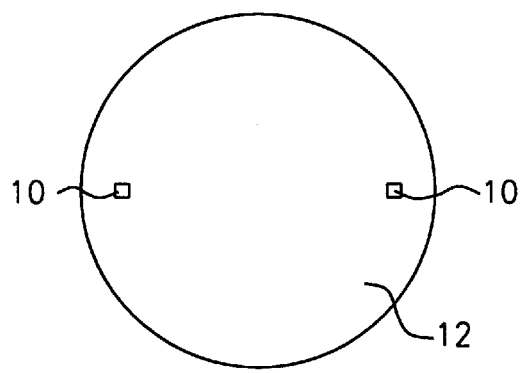
FIG. 1   Prior Art
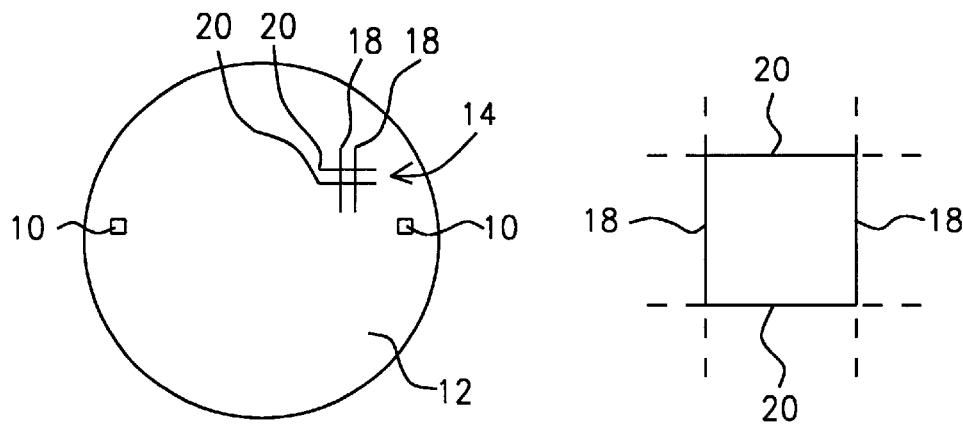
FIG. 2a         FIG. 2b
Prior Art       Prior Art
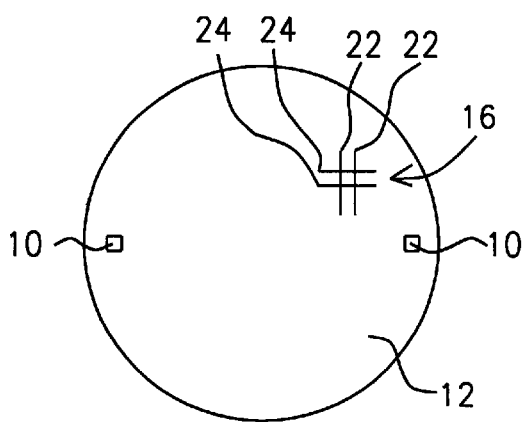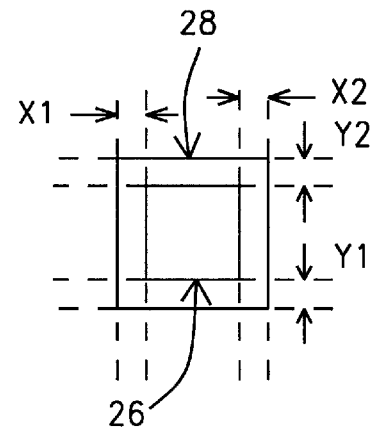
FIG. 3a         FIG. 3b
Prior Art       Prior Art

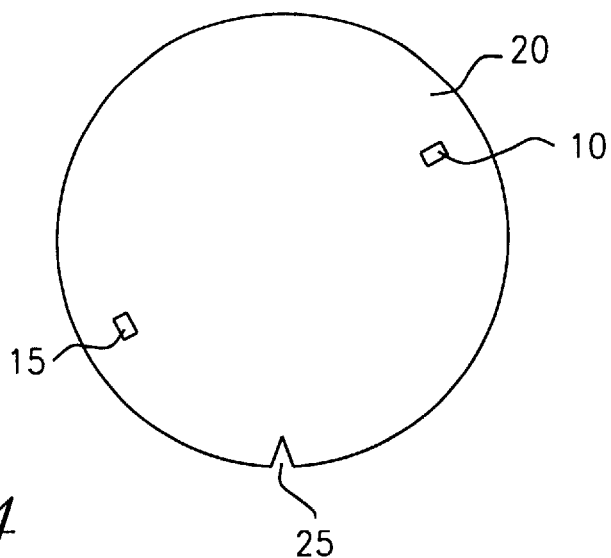
FIG. 4
FIG. 5a
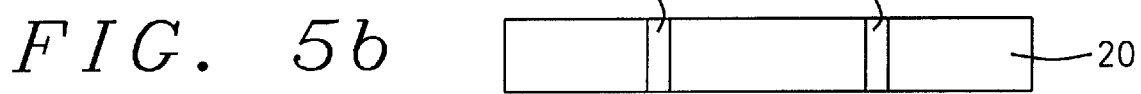
FIG. 5b
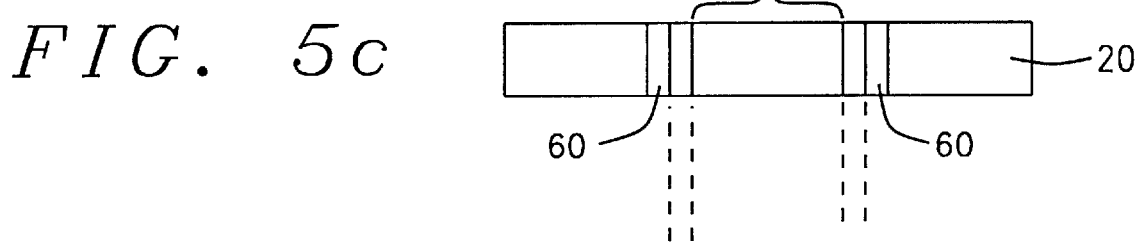
FIG. 5c
FIG. 5d
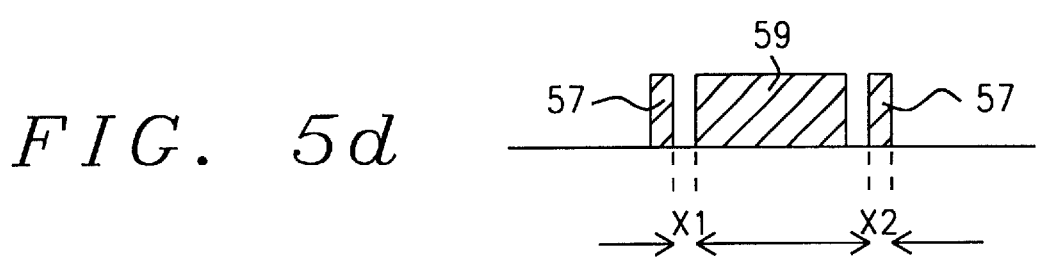

D-100  ☐ X,Y distance decrease 100 nm

D-80   ☐ X,Y distance decrease 80 nm

D-60   ☐ X,Y distance decrease 60 nm

D-40   ☐ X,Y distance decrease 40 nm

D-20   ☐ X,Y distance decrease 20 nm

D      ☐ Standard distance: there is no shift between centers of big frame and small frame D+20   ☐ X,Y distance increase 20 nm D+40   ☐ X,Y distance increase 40 nm D+60   ☐ X,Y distance increase 60 nm D+80   ☐ X,Y distance increase 80 nm D+100  ☐ X,Y distance increase 100 nm

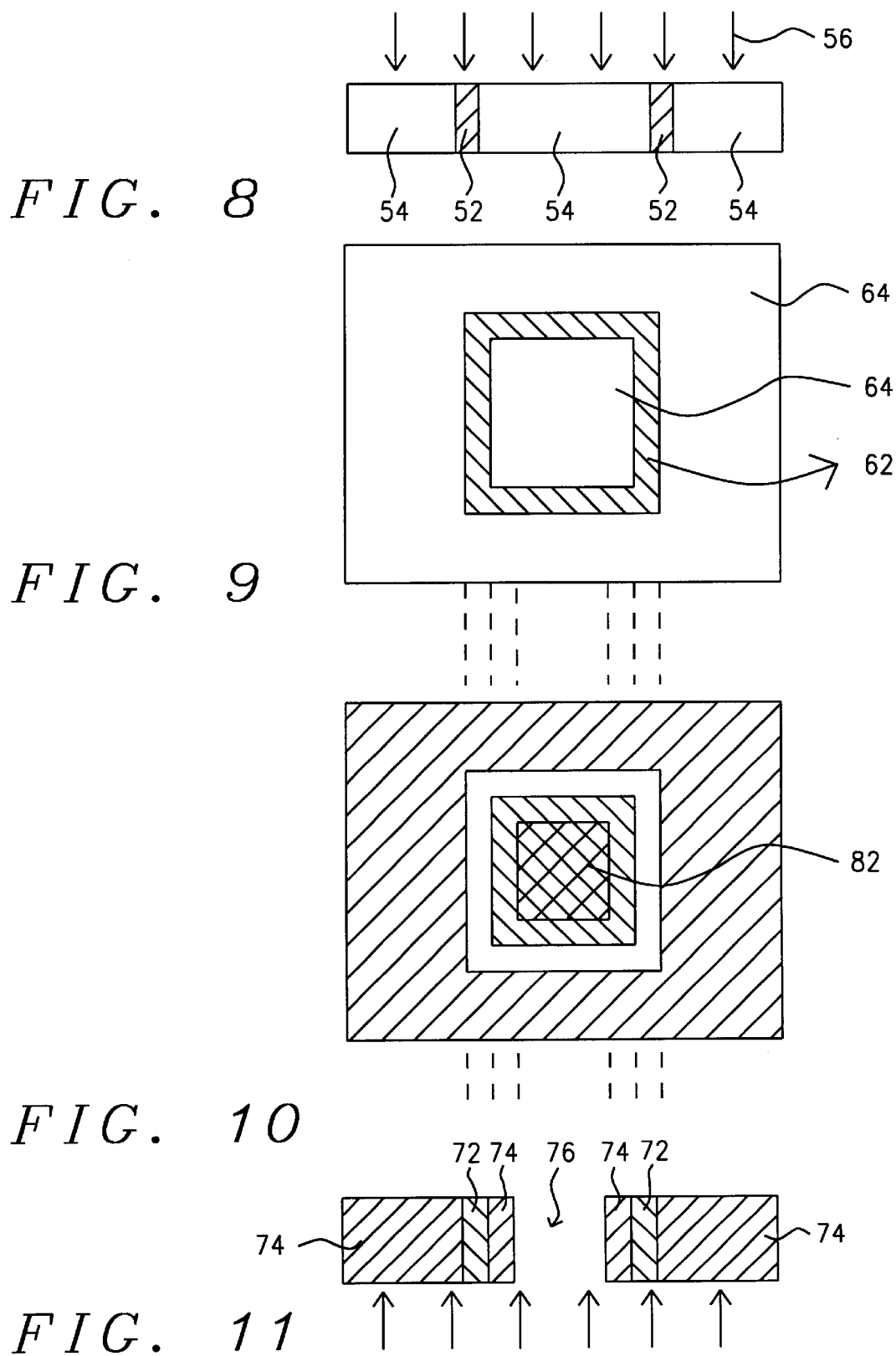

OVERLAY RELIABILITY MONITOR

BACKGROUND OF THE INVENTION

1. Field of the Invention

The present invention relates to the fabrication of integrated circuits and, more specifically, to a method and apparatus for measuring and calibrating the registration between overlying layers on the surface of a semiconductor wafer.

2. Description of the Prior Art

The fabrication of complex semiconductor devices involves multiple processing steps. Multiple patterned layers of different materials are applied to a substrate to create the desired electronic semiconductor device. The different layers overlie each other and must be accurately registered to ensure proper operation of the semiconductor device. Displacement between corresponding features on different layers can degrade the performance of the device or can cause the device to be totally inoperative. As semiconductor devices have become increasingly complex, the feature dimensions have been correspondingly reduced. This reduction in feature dimensions has reduced acceptable tolerances or displacements between the various layers within a semiconductor device.

Most semiconductor devices are now made using photolithographic techniques. Such techniques involve the exposure of the surface of a semiconductor body to a particular pattern, and the subsequent formation or development of that pattern into permanent form through the use of wet or dry etching techniques that create various regions and structures on the surface of the semiconductor body. As is well known in the state of the art, photolithographic procedures require that a mask be used to define those portions of the semiconductor material where various elements of semiconductor devices are to be located. Because different parts or elements of these semiconductor devices must be located at precisely defined distances from each other, it is desirable that each of the masks used in forming the semiconductor device is aligned with respect to the other masks as precisely as possible both in vertical and in horizontal directions.

These operations of alignment are typically performed visually by examining the surface of the semiconductor wafer and the mask under a microscope.

Standard practice in positioning and aligning a wafer during wafer processing operations is to use an inspection pattern on the semiconductor wafer to determine the degree of alignment of a first device layer.

A great number of the processing steps used during the manufacturing of semiconductor devices are based on the application of photolithographic exposures. Of key importance in making successive photolithographic exposures is that successive layers of patterns are accurately aligned with respect to each other. The degree of misalignment that can occur between successive photolithographic exposures is known as pattern overlay, overlay than represents the degree of misalignment that occurs between successive layers of patterns on thin film electronic structures and the preceding layer.

The term overlay represents the relative location of features formed during different steps of the semiconductor wafer processing sequence. The overlay is a numeric quantity that is defined at every location on the substrate as the difference between a numerical value indicative of a position or location on the first formed portion of a semiconductor structure on a substrate and a numeric quantity of the corresponding point on a following or second formed portion of a semiconductor structure. Perfect alignment between the first and the second portion of the semiconductor structure requires that the overlay, as defined here, be equal to zero.

One approach in aligning wafer is to use an independent process layer, the so-called zeroth layer, as the source of reference and to align all process layers to this zeroth layer. Techniques and measuring tools are provided to measure the degree of shift that occurs in the overlay of the successive layers and patterns. All these techniques use alignment patterns of a particular design that are applied to both successive and preceding layers. The first layer used in this alignment sequence does, by its very nature, not have a reference point or pattern. This may lead to considerable problems of alignment in subsequent alignment steps.

FIG. 1 shows the Prior Art method of placing reference marks 10 on the surface of wafer 12, this top view of the wafer surface represents the previously highlighted zeroth layer process. This process places the reference marks on the surface of the substrate. Successive formations of patterns use marks 10 as alignment marks, it is a given that the overlay of the marks 10 for the successive patterns that are formed on the semiconductor substrate is zero. That is the marks 10 are, going from the preceding to the following deposition of patterns, in perfect alignment. Measured is the overlay within the successive patterns while these patterns are being created.

FIG. 2a shows the Prior Art creation of a preceding pattern 14 formed on the wafer 12 by use of prior art method of chip manufacturing using two intersecting patterns 18 and 20. FIG. 2b shows a magnification of the pattern 14 as representative of the first pattern that is created on the surface of the semiconductor substrate. This pattern is created at scribe lines within the surface of the semiconductor substrate and serves as the reference pattern for the measurement of the alignment of the following patterns.

FIG. 3a shows the Prior Art formation of a following or second pattern 16 on the surface of the semiconductor substrate as representative of the second pattern that is created on the surface of the semiconductor substrate. The pattern 16 is created by use of prior art method of chip manufacturing using two intersecting patterns 22 and 24. The pattern 16 (FIG. 3a) is roughly in the same geometric location on the wafer surface as the previously highlighted first pattern (pattern 14, FIG. 2a). FIG. 3b shows a magnified image where the reference pattern (pattern 14, FIG. 2a) is superimposed over the pattern that is representative of the second pattern (pattern 16, FIG. 3a). The smaller square 26 is patterned in the second pattern in the same geometric location as the reference square 28.

It is clear from FIG. 3b that in measuring values for $x_1$, $x_2$, $y_1$ and $y_2$ accurate conclusions can be drawn relating to the relative position of the second pattern (pattern 16, FIG. 3a) with respect to the first or reference pattern (patter 14, FIG. 2a). It is also clear that the alignment accuracy of following layers can be determined in the same manner.

The use of marks on the mask and on the wafer is known to facilitate alignment between the various masks. This approach however can be very time consuming and is influenced by human error. The present invention therefore teaches a method that is both simple and dependable, thus contributing to increased product reliability and a considerable improvement in product yield.

U.S. Pat. No. 5,617,340 (Cresswell et al.) shows a method for measuring overlay and for calibrating image tools.

U.S. Pat. No. 5,280,437 (Corliss) shows a method for direct calibration of registration measurement systems.

U.S. Pat. No. 4,571,538 (Chow) shows a mask alignment measurement structure.

U.S. Pat. No. 4,538,105 (Ausschnitt) discloses an overlay test wafer.

SUMMARY OF THE INVENTION

In accordance with the present invention, it is an objective of the present invention to facilitate wafer alignment procedures.

Another objective of the present invention is to eliminate the need for using standard or reference wafers presently used for wafer alignment.

Yet another objective of the present invention is to allow for quick and dependable validation of wafer alignment during scheduled Preventive Maintenance.

Yet another objective of the present invention is to allow for frequent and dependable verification of wafer alignment during semiconductor manufacturing operations.

Yet another objective of the present invention is to verify the reliability of wafer alignment.

Yet another objective of the present invention is to decrease the overall cost of manufacturing semiconductor devices.

Yet another objective of the present invention is to simplify wafer alignment procedures by requiring no more that one reference mark on the control wafer.

In accordance with the indicated objectives of the present invention, the invention teaches a method of overlaying two images and from this overlay observe and measure the accuracy of the alignment of the wafer. Wafer misalignment can be readily corrected based on the results of these observations. Alignment marks are provided on the surface of the wafer that is being validated for accuracy of alignment. The key point of the invention is that double exposure is performed on the same wafer to validate alignment between two reference marks. The relative positioning of the two reference marks with respect to each other determines the amount of overlay of the wafer that is being evaluated for proper positioning. The term overlay as used here indicates the accuracy by which a wafer handling tool positions a wafer within that tool.

BRIEF DESCRIPTION OF THE DRAWINGS

FIG. 1 shows a wafer surface with Prior Art zeroth layer.

FIG. 2a shows a wafer surface with Prior Art first pattern.

FIG. 2b shows a wafer surface with a magnification of the Prior Art first pattern.

FIG. 3a shows a wafer surface with Prior Art second pattern.

FIG. 3b shows a wafer surface with a magnification of the Prior Art second pattern superimposed over the Prior Art first pattern.

FIG. 4 shows the alignment marks on top of the surface of the wafer that is being validated for alignment accuracy.

FIGS. 5a through 5d show the process that is being used to perform the alignment procedure, as follows:

FIG. 5a shows the alignment measurement tool used during the alignment measurement procedure.

FIG. 5b shows the image of the small box alignment marks on top of the wafer that is being checked for alignment accuracy.

FIG. 5c shows the image of the big frame image on top of the wafer that is being checked for alignment accuracy.

FIG. 5d shows the pattern that is developed during the alignment procedure.

FIG. 6a shows a top view of the image obtained for a wafer which is aligned since the small box 34 is centered in the middle of the big frame 32.

FIG. 6b shows a top view of the image obtained for a wafer which is not aligned since the small box 34 is not centered in the middle of the big frame 32.

FIG. 7a shows a multiplicity of big frames with the adjustments D-x that have to be made in order to center the small box in the center of the big frame. Where, for instance D-60 is indicated, the X-Y distance have to be adjusted by 60 nano-meter in order for the small box to be within the center of the big frame.

FIG. 7b shows the various adjustments that can be made to the small box in order to center the small box within the big frame.

FIG. 8 shows the image or mask used for the creation of the big frame.

FIG. 9 shows the big frame after its creation.

FIG. 10 shows the small box after its creation.

FIG. 11 shows the image or mask used for the creation of the small box.

DETAILED DESCRIPTION OF THE PREFERRED EMBODIMENT

Figures 6A, 6B:
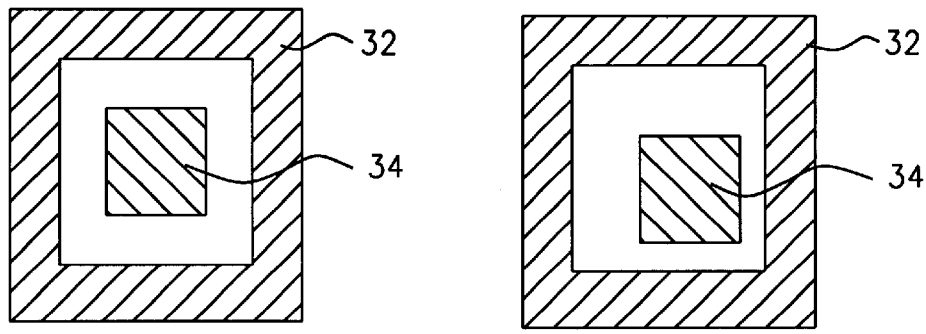
FIGS. 6a and 6b show a top view of the image obtained during the alignment procedure, as follows.

Referring now specifically to FIG. 4, there is shown production wafer 20 with two alignment marks 10 and 15 together with the wafer orientation notch 25. Wafer 20 is the wafer that is being validated for alignment accuracy, that is it is the wafer that has been entered into a wafer handling tool whereby the alignment of the wafer within this tool needs to be determined. The alignment marks 10 and 15 are at opposite sites of the wafer 20 with the line connecting these two marks running through the geometric center of the wafer. The two alignment marks 10 and 15 have the shape of a square, the size of the sides of this square are not basic to the intent of the present invention. The two alignment marks 10 and 15 are of equal size, that is approximately 0.5×0.5 mm.

FIG. 5a shows the alignment tool 30 used to observe the wafer alignment. Wafer alignment is, in most instances, performed by validating the alignment of the photo-resist pattern.

the procedure for checking wafer alignment within a particular wafer handling tool is as follows. As first step, the wafer is inserted into the tool that is being evaluated for wafer alignment accuracy. The alignment-measuring tool 30 creates a first exposure 40 of the "big frame", 42, FIG. 5b. Wafer alignment tool 30 (FIG. 5a) makes a second exposure 50, FIG. 5c, creating the image of the alignment "small box" 52, FIG. 5c. The position of the "small box" 52 is compared with the previously obtained image 42 of the "big frame". These steps will be further highlighted in the following figures.

FIG. 5b shows a cross section view of the first exposure 40 of the "large frame" 42. The accuracy or resolution setting of this alignment tool is at this time in the explanation not of great importance, it will later become apparent how this accuracy can further be used to improve the accuracy of measuring the wafer alignment.

FIG. 5c shows the cross section of the second exposure 50 obtained by the alignment tool 30 of the "small box" 52. The areas 60 (FIG. 5c) are visually lined up with the areas 42 (FIG. 5b).

FIG. 5d shows the combined image of the "large frame" (42, FIG. 5b) exposure 57 and the "small box" image (52, FIG. 5c) exposure 59. Since the image of the "large frame" 57 is used as the reference, it can readily understood that the degree of centering of image of the "small box" 59 within the large frame is a direct indication as to how well the wafer is aligned. This alignment than can be measured directly by measuring the parameters $X_1$ and $X_2$ of FIG. 5d. This will be further highlighted in the following figures.

FIG. 6a shows a top view of the large frame 32, which is the same as large frame 57 shown in FIG. 5d, and the alignment small box 34, which is the same as the small box 59 shown in FIG. 5b. The relative positioning of the alignment small box 34 within the large frame 32 as indicated in FIG. 6a shows that the marker is centered in the middle of the large frame which is the condition where the production wafer is in perfect alignment with the standard or reference wafer.

FIG. 6b illustrates the case where the alignment marker 34 is not in the center of the large frame 32 in which case the production wafer is not in alignment with the reference wafer.

Figures 7A, 7B:
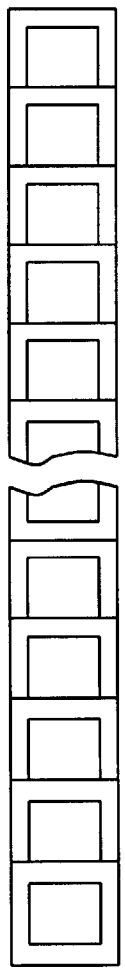
FIGS. 7a and 7b show how the alignment procedure of the present invention can be applied for increased accuracy of alignment, as follows.

FIGS. 7a and 7b indicate a range of alignment settings where, for the ideal case, there is no shift of the alignment marker with respect to the sides of the large frame. The images of the large frame, FIG. 7a, can be quickly adjusted with respect to the images of the alignment small box, FIG. 7b. By centering the alignment marker within the large frame, the scale shown adjacent to the alignment markers provides a direct reading as to the alignment of the wafer.

Prior Art alignment measurements have used a production wafer in combination with a reference wafer. For instance, D+60 indicates that, by moving the wafer within the wafer handling tool and centering the alignment marker within the large frame after this movement, the X and Y coordinates of the production wafer have increased with 60 nano-meter (60 nm) with respect to its previous position. By therefore fixing the position of the reference wafer, the production wafer can be adjusted to perfect alignment with the reference wafer. Inversely, by not adjusting the production wafer with respect to the reference wafer, it can be measured how far the production wafer is out of alignment with respect to the reference wafer. This measurement reflects the previously indicated AB measurement, that is the measurement that indicates how far a wafer that is positioned in a wafer handling tool is out of alignment with respect with its desired position, that is the position of the standard wafer.

The present invention teaches the elimination of AB matching and the replacement of the AB alignment with the AA alignment. AB alignment used a production wafer and a reference wafer for monitoring of the overlay. The AA measurement is the measurement of wafer alignment accuracy by performing the above detailed double exposure of one wafer and from this double exposure determine how well that wafer is aligned within the wafer handling tool.

FIG. 8 shows the exposure 56 by the alignment analysis tool of the mark or image that is attached to the top of the standard or reference wafer. The mark in this case consists of a square 54; the cross section of the sides of this square is indicated as 52. These sides are recorded by the failure analysis tool as a big frame.

FIG. 9 shows the frame 62 recorded by the wafer alignment analysis tool. This frame serves as a reference structure into which an image of the wafer that is being measured for alignment is projected. The positioning of this latter image with respect to frame 62 gives a measure of how the wafer that is being evaluated is positioned with respect to this frame. The areas, which are not exposed or show no image in the wafer analysis tool, are indicated as 64.

FIG. 10 shows the recorded small box 82, all the other areas within this image are not recorded by the image analysis tool.

FIG. 11 gives a cross section view of the frame or image that is provided on the top surface of the wafer that is being evaluated for alignment. The areas 72 are used for alignment with the big frame that has previously been observed (see above under FIG. 9), the wafer alignment tool does not record the areas 72 and areas 74. The wafer alignment tool records the area 76; this area forms the so-called small box.

Figure 12:
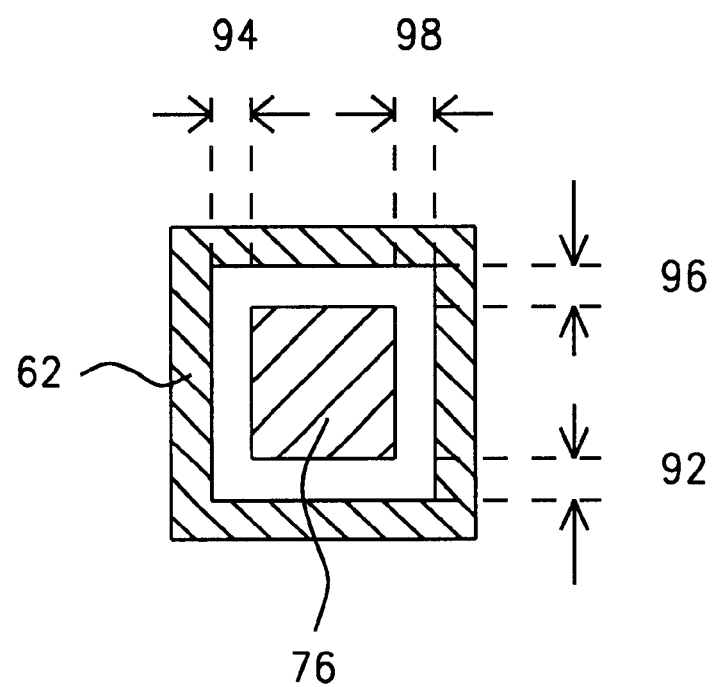
FIG. 12 shows the overlay of the big frame with the small box.

FIG. 12 shows the combination of the big frame 62 superimposed over the small box 82. From this figure it is apparent that the dimensions 92, 94, 96, and 98 are indicative as to how well the small box 82 is centered within the big frame 62 where the big frame 62 forms the standard or source of reference.

Although specific embodiments have been illustrated and described, it will be obvious to those skilled in the art, that various modifications may be made without departing f rom the spirit and scope of the present invention which is limited solely by the appended claims.

What is claimed is:

1. A method of quantitatively measuring the relative alignment of a semiconductor wafer within a wafer handling tool comprising the steps of:

providing a semiconductor wafer;

providing a reference pattern on top of said semiconductor wafer;

providing a semiconductor wafer processing tool;

providing a wafer alignment measurement tool, an alignment measurement pattern being provided by said alignment reference tool; and comparing alignment of said reference pattern with said alignment measurement pattern.

2. The method of claim 1 wherein said semiconductor wafer is bare silicon semiconductor substrate.

3. The method of claim 1 wherein said reference pattern on top of said wafer is a square.

4. The method of claim 1 wherein said wafer alignment measurement tool provides a wafer alignment measurement pattern, wherein said Wafer alignment measurement pattern is of a geometric design that is identical to a geometric design of said reference pattern on top of said wafer, whereby further said wafer alignment measurement pattern can be aligned with said reference pattern on top of said wafer.

5. The method of claim 1 wherein said comparing of said reference pattern on top of said wafer with said wafer alignment measurement pattern is aligning said wafer alignment measurement pattern with said reference pattern followed by exposing said wafer alignment measurement pattern followed by exposing said reference pattern on top of said wafer, whereby said exposures are super-imposed such that said super-imposed exposure provides a measurement of relative positioning between said reference frame and said wafer alignment measurement frame.

6. The method of claim 5 wherein said aligning said wafer alignment measurement pattern with said reference pattern is aligning said reference mark with said wafer alignment measurement tool.

7. The method of claim 1 wherein said reference pattern on top of said wafer is a square that matches with said wafer alignment measurement pattern and whereby outside dimensions of said square are smaller than inside dimensions of said wafer alignment measurement pattern by a measurable amount.

8. The method of claim 1 wherein said reference pattern on top of said wafer is a rectangle.

9. The method of claim 1 wherein said reference pattern on top of said wafer is of known geometric design.

10. The method of claim 1 wherein said reference pattern on top of said wafer is a multiplicity of squares.

11. The method of claim 1 wherein said reference pattern on top of said wafer is a multiplicity of rectangles.

12. The method of claim 1 wherein said reference pattern on top of said wafer is of a multiplicity of known geometric designs.

13. The method of claim 1 whereby the step of comparing alignment of said wafer with said alignment measurement pattern of said wafer is comparing inner dimensions of said alignment measurement pattern with outer dimensions and said reference pattern.

14. The method of claim 13 wherein comparing outer dimensions of said reference pattern with inner dimensions of said alignment measurement pattern is subtracting said outer dimension from said inner dimension where both dimensions are measured along a straight line that originates from a geometric center of said alignment pattern but is not limited to a line that originates from a geometric center of said alignment pattern.

15. The method of claim 1 wherein a wafer alignment measurement tool is a tool that can, in adequate detail and with adequate resolution, measure images that are presented to it where said adequate detail and adequate resolution extends to a nano-meter range.

16. A design for quantitatively measuring the relative alignment of a semiconductor wafer within a wafer handling tool containing:

a reference pattern on top of said semiconductor wafer;

wafer alignment measurement tool for comparing of said reference pattern on top of said wafer with a wafer alignment measurement pattern.

17. The design of claim 16 wherein said reference pattern on top of said wafer is a square.

18. The design of claim 16 wherein said wafer alignment measurement tool provides a wafer alignment measurement pattern, wherein said wafer alignment measurement pattern is of a geometric design that is identical to a geometric design of said reference pattern on top of said wafer, whereby further said wafer alignment measurement pattern can be aligned with said reference pattern on top of said wafer.

19. The design of claim 16 wherein said comparing of said alignment measurement pattern is aligning said wafer alignment measurement pattern with said reference pattern followed by exposing said wafer alignment measurement pattern followed by exposing said reference pattern on top of said wafer, whereby said exposures are super-imposed such that said super-imposed exposure provides a measurement of relative positioning between said reference frame and said wafer alignment measurement frame.

20. The design of claim 19 wherein said aligning said wafer alignment measurement pattern with said reference pattern is aligning said reference mark with said wafer alignment measurement tool.

21. The design of claim 16 wherein said reference pattern on top of said wafer is a square that matches with said wafer alignment measurement pattern and whereby outside dimensions of said square are smaller than inside dimensions of said wafer alignment measurement pattern by a measurable amount.

22. The design of claim 16 wherein said reference pattern on top of said wafer is a rectangle.

23. The design of claim 16 wherein said reference pattern on top of said wafer is of known geometric design.

24. The design of claim 16 wherein said reference pattern on top of said wafer is a multiplicity of squares.

25. The design of claim 16 wherein said reference pattern on top of said wafer is a multiplicity of rectangles.

26. The design of claim 16 wherein said reference pattern on top of said wafer is of a multiplicity of known geometric designs.

27. The design of claim 16 whereby the step of comparing the alignment of said wafer with said alignment measurement pattern of said wafer is comparing inner dimensions of said alignment measurement pattern with outer dimensions of said reference pattern.

28. The design of claim 27 wherein comparing outer dimensions of said reference pattern with inner dimensions of said alignment measurement pattern is subtracting said outer dimension from said inner dimension where both dimensions are measured along a straight line that originates from a geometric.

29. The design of claim 16 wherein a wafer alignment measurement tool is a tool that can, in adequate detail and with adequate resolution, measure images that are presented to it where said adequate detail and adequate resolution extends to a nano-meter range.

* * * * *